(12) United States Patent
Fish

(10) Patent No.: US 7,764,115 B1
(45) Date of Patent: Jul. 27, 2010

(54) SYSTEM AND METHOD FOR PROVIDING A HIGH INPUT COMMON MODE CURRENT CONVEYOR

(75) Inventor: Adam Nicholas Fish, Portland, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 57 days.

(21) Appl. No.: 11/154,436

(22) Filed: Jun. 16, 2005

(51) Int. Cl.
G05F 1/10 (2006.01)
G05F 3/02 (2006.01)

(52) U.S. Cl. .................................... 327/543
(58) Field of Classification Search .............. 327/538, 327/540, 541, 543
See application file for complete search history.

(56) References Cited

U.S. PATENT DOCUMENTS

| | | | | |
|---|---|---|---|---|
| 5,579,006 A | * | 11/1996 | Hasegawa et al. | 341/162 |
| 5,917,368 A | * | 6/1999 | Tan et al. | 327/543 |
| 5,939,933 A | * | 8/1999 | Wang | 327/512 |
| 6,630,818 B1 | * | 10/2003 | Comer et al. | 323/315 |
| 6,788,134 B2 | * | 9/2004 | Secareanu | 327/543 |

* cited by examiner

*Primary Examiner*—Quan Tra

(57) ABSTRACT

A system and method is disclosed for providing an improved current conveyor circuit in a mobile pixel link (MPL) receiver that can provide an increased input common mode voltage to allow a greater tolerance of noise on a transmission line. The current conveyor circuit comprises (1) a PMOS transistor with a source coupled to an operating voltage Vdd and a drain that is coupled to a current source, and (2) an NMOS transistor with a source coupled to an input terminal of the current conveyor circuit and a drain coupled to a low voltage input current mirror. The current conveyer circuit increases the range of the common mode voltage of the receiver without adversely affecting the functionality of the receiver.

20 Claims, 3 Drawing Sheets

DC ANALYSIS OF CURRENT CONVEYOR

AC ANALYSIS OF CURRENT CONVEYOR

SYSTEM AND METHOD FOR PROVIDING A HIGH INPUT COMMON MODE CURRENT CONVEYOR

TECHNICAL FIELD OF THE INVENTION

The present invention relates generally to integrated circuits and, more particularly, to a system and method for providing a high input common mode current conveyor.

BACKGROUND OF THE INVENTION

A major goal in the design and manufacture of electronic circuitry is to increase the accuracy, precision and capability of wireless handheld devices such as cellular phones. The newer types of cellular phones incorporate digital cameras and data service features. These features require the presence of high density, high color display modules. This means that there is an increasing need for wide, high-speed parallel interfaces to interconnect between baseband processors, application processors, image processors and the input/output (I/O) devices that they support (such as digital cameras and display modules).

One type of interface used in such devices is referred to as a Mobile Pixel Link (MPL). The MPL interface uses a very low power, low electromagnetic interference (EMI) current mode transceiver technology. The MPL interface is capable of supporting digital camera interfaces, color RGB (red, green, blue) interfaces, and central processing unit (CPU) interfaces.

A block diagram of an exemplary prior art high common mode input mobile pixel link (MPL) receiver 100 is illustrated in FIG. 1. A transmitter represented by current source $I_{DC}$ provides a data signal through transmission line 110 to current conveyor 120 of receiver 100. The output of transmission line 110 is coupled to a first end of matching resistor R. In one commonly encountered embodiment transmission line 110 has an impedance of fifty ohms (50Ω) and matching resistor R has a resistance of fifty ohms (50Ω).

The second end of matching resistor R is coupled to a node in current conveyor 120 that is designated "acgnd" (representing an "alternating current (AC) ground"). Current conveyor 120 comprises two NMOS (N-type metal oxide semiconductor) transistor circuits. The first transistor (NMOS transistor $M_1$) is designated "MNIN" and the second transistor (NMOS transistor $M_2$) is designated "MN Bias".

As shown in FIG. 1, the source of the first transistor MNIN and the gate of the second transistor MN Bias are both coupled to the "acgnd" node. The source of the second transistor MN Bias is coupled to ground. The gate of the first transistor MNIN and the drain of the second transistor MN Bias are both coupled to a node in current conveyor 120 that is designated "ning".

The drain of the first transistor MNIN is coupled to current source $I_{DC}$ through a node that is designated "Low Swing". The gate of the first transistor MNIN and the drain of the second transistor MN Bias are both coupled to current source $I_{LOW}$ through the "ning" node. The "Low Swing" node is coupled to the input of a clamp circuit 130 that comprises an NMOS (N-type metal oxide semiconductor) transistor designated "MNFB" and a PMOS (P-type metal oxide semiconductor) transistor designated "MPFB". The "Low Swing" node is also coupled to an input of inverter circuit 140. The output of the clamp circuit 130 and the output of inverter circuit 140 are coupled to a node that is designated "High Swing". The "High Swing" node is coupled to an input of inverter circuit 150. The output of inverter circuit 150 is provided to an output terminal designated "OUT".

The low common mode voltage of prior art MPL receiver 100 can create problems for a transmitter in the presence of noise. Cellular noise affects both the MPL Level Zero current level (450 microamperes) and the MPL Level One current level (2 milliamperes). To reduce the cellular noise effects it would be desirable to raise the input common mode voltage as high as possible. However, raising the input common mode voltage must be done without adversely affecting the functionality of the MPL receiver 100.

Because the MPL transceiver is the first circuitry to fail, raising the input common mode voltage of the MPL receiver 100 will give more headroom on the MPL transmission line. However, when the voltage is increased at the "acgnd" node in current conveyor 120, two failures will occur in the following order.

First, note that the "Low Swing" node in MPL receiver 100 is a fixed voltage when the data current is modeled by a static current. Typically the fixed voltage on the "Low Swing" node is one half of the supply voltage (i.e., nine tenths of a volt (0.9 V)). If the voltage at the "acgnd" node is increased, then the drain to source voltage ($V_{DS}$) of the first transistor MNIN will be decreased. This will cause the first transistor MMIN to go into the triode state and will distort the response of the current conveyor 120. (This is Problem No. 1).

Second, assume that the voltage at the "acgnd" node can be increased without creating Problem No. 1. Increasing the voltage at the "acgnd" node will cause the voltage at the "ning" node to increase. This will eventually cause the current that flows through the second transistor MN Bias to decrease. This will cause a loss of gain in current conveyor 120. (This is Problem No. 2).

Assume that the voltage at the "acgnd" node can be increased without creating Problem No. 1 and without creating Problem No. 2. In that case, increasing the voltage at the "acgnd" node would create either (1) a loss of gain, or (2) an increase in current consumption. (This is Problem No. 3).

There is therefore a need in the art for a system and method for providing an improved current conveyor circuit in a mobile pixel link (MPL) receiver. In particular, there is a need in the art for an improved current conveyor circuit in a mobile pixel link (MPL) receiver that can provide an increased input common mode voltage to allow a greater tolerance of noise on an MPL transmission line.

SUMMARY OF THE INVENTION

To address the above-discussed deficiencies of the prior art, it is a primary object of the present invention to provide an improved current conveyor circuit in a mobile pixel link (MPL) receiver that can provide an increased input common mode voltage to allow a greater tolerance of noise on an MPL transmission line.

An advantageous embodiment of the present invention comprises an improved current conveyor circuit within a mobile pixel link (MPL) receiver. The current conveyor circuit comprises a PMOS transistor having a source that is coupled to an operating voltage Vdd and a drain that is coupled to a current source. The current conveyor circuit also comprises an NMOS transistor having a source that is coupled to an input terminal of the current conveyor circuit and a drain that is coupled to a low voltage input current mirror. In one advantageous embodiment of the invention the input current $I_{IN}$ in the low voltage input current mirror is four times the output current $I_{OUT}$ from the low voltage input current mirror.

The operation of the current conveyer circuit of the invention effectively increases the range of the common mode voltage of the receiver without adversely affecting the functionality of the receiver. The NMOS transistor and the PMOS transistor are kept in saturation during operation of the mobile pixel link (MPL) receiver. As will be more fully described, this is accomplished by keeping the gate to source voltage of the NMOS transistor less than or equal to the threshold voltage of the PMOS transistor.

It is an object of the present invention to provide a system and method for providing an improved current conveyor circuit in a mobile pixel link (MPL) receiver.

It is also an object of the present invention to provide a system and method for providing an improved current conveyor circuit in a mobile pixel link (MPL) receiver that can provide an increased input common mode voltage to allow a greater tolerance of noise on an MPL transmission line.

It is yet another object of the invention to provide a system and method for providing an improved current conveyor circuit in a mobile pixel link (MPL) receiver that can effectively increase the range of an input common mode voltage of the MPL receiver without adversely affecting the functionality of the MPL receiver.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; "each" means every one of at least a subset of the identified items; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future, uses of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

Figure 1:
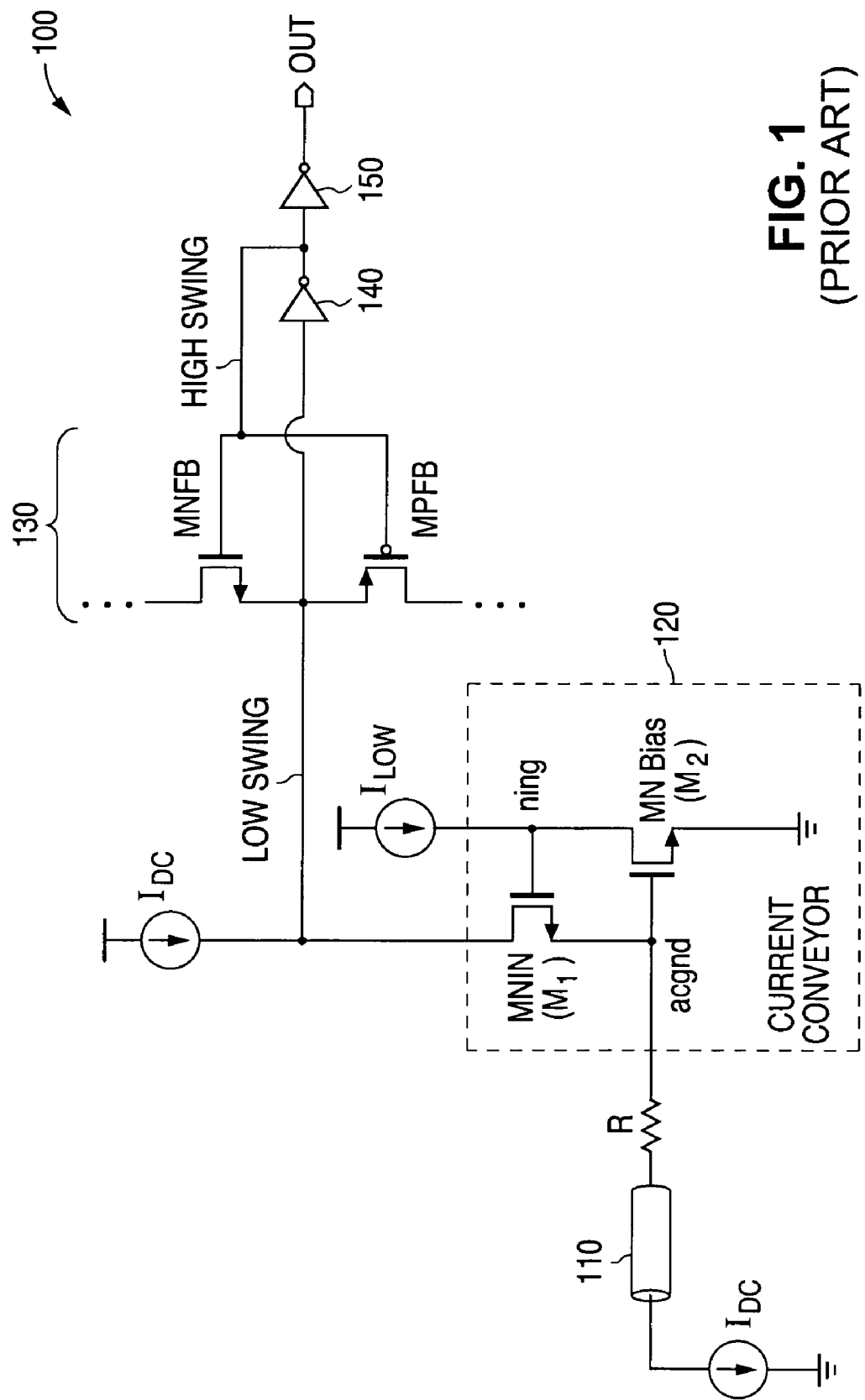
FIG. 1 is a block diagram illustrating a prior art high common mode input mobile pixel link (MPL) receiver with a prior art current conveyor circuit.
Figure 2:
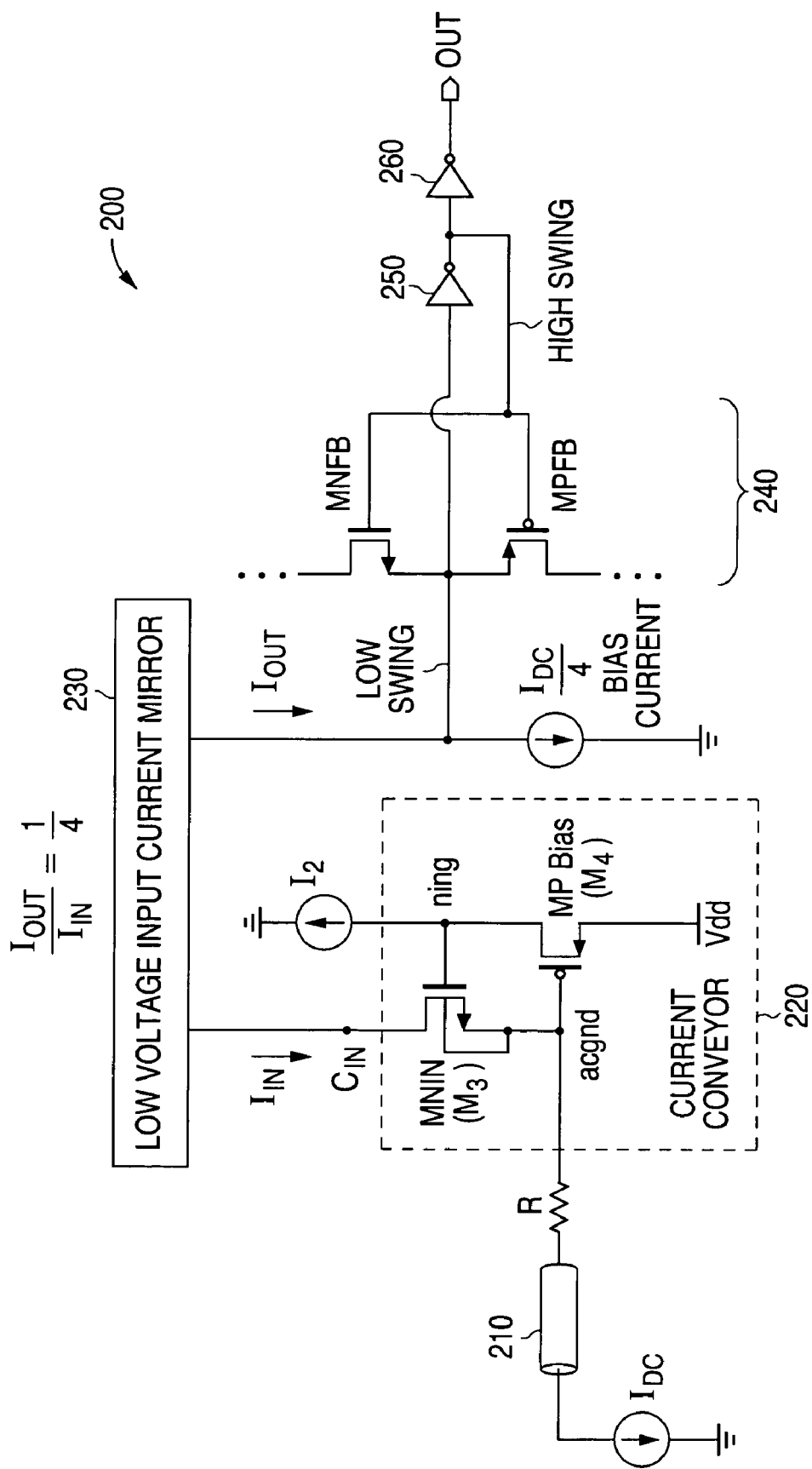
FIG. 2 is a block diagram illustrating a high common mode input mobile pixel link (MPL) receiver of the present invention with a current conveyor circuit of the present invention.
Figure 3:
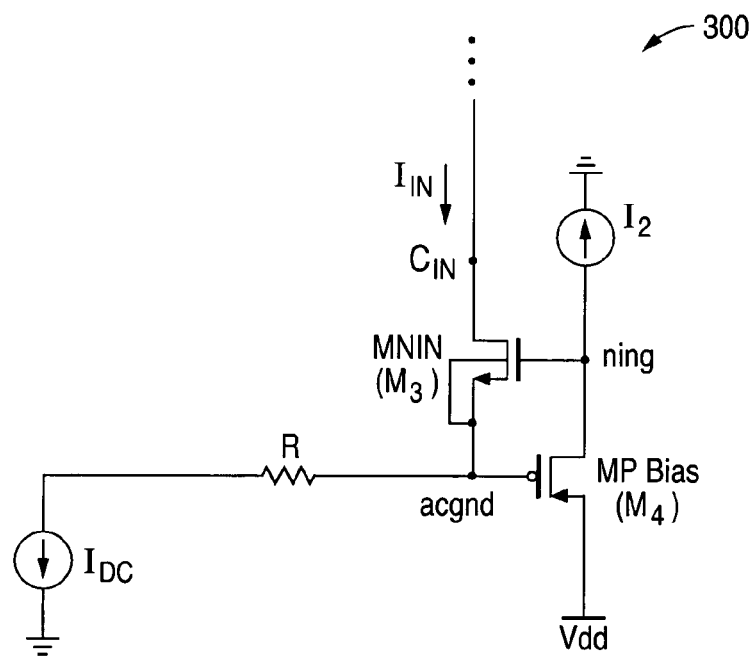
FIG. 3 is a block diagram of a portion of the circuit shown in FIG. 2 illustrating a direct current (DC) analysis of the current conveyor circuit of the present invention.
Figure 4:
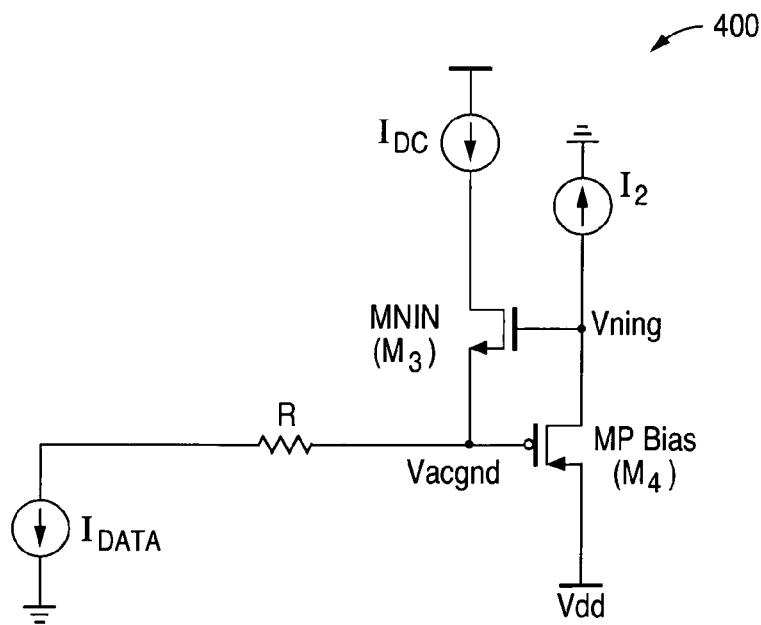
FIG. 4 is a block diagram of a portion of the circuit shown in FIG. 2 illustrating an alternating current (AC) analysis of the current conveyor circuit of the present invention.

FIGS. 2 through 4, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged high input common mode mobile pixel link (MPL) receiver.

FIG. 2 is a block diagram illustrating a high common mode input mobile pixel link (MPL) receiver 200 of the present invention with a current conveyor circuit 220 of the present invention. A transmitter represented by current source $I_{DC}$ provides a data signal through transmission line 210 to current conveyor 220 of receiver 200. The output of transmission line 210 is coupled to a first end of matching resistor R. In one commonly encountered embodiment transmission line 210 has an impedance of fifty ohms (50Ω) and matching resistor R has a resistance of fifty ohms (50Ω).

The second end of matching resistor R is coupled to a node in current conveyor 220 that is designated "acgnd" (representing an "alternating current (AC) ground"). Current conveyor 220 comprises one NMOS (N-type metal oxide semiconductor) transistor circuit and one PMOS (P-type metal oxide semiconductor) transistor circuit. The NMOS transistor (NMOS transistor $M_3$) is designated "MNIN" and the PMOS transistor (PMOS transistor $M_4$) is designated "MP Bias".

As shown in FIG. 2, the source of the NMOS transistor MNIN and the gate of the PMOS transistor MP Bias are both coupled to the "acgnd" node. The source of the PMOS transistor MP Bias is coupled to operating voltage Vdd. The gate of the NMOS transistor MNIN and the drain of the PMOS transistor MP Bias are both coupled to a node in current conveyor 220 that is designated "ning". In one embodiment, the source and bulk of NMOS transistor MNIN can be tied together to reduce the threshold voltage in NMOS transistor MNIN.

The drain of the NMOS transistor MNIN is coupled to an input of a low voltage input current mirror 230 through a node that is designated "$C_{IN}$". The drain of NMOS transistor MNIN conveys a current $I_{IN}$ to current mirror 230 from the transmission current. The gate of the NMOS transistor MNIN and the drain of the PMOS transistor MP Bias are both coupled to a first terminal of current source $I_2$ through the "ning" node. The second terminal of current source $I_2$ is coupled to ground.

The output of low voltage input current mirror 230 is coupled to a first terminal of a bias current source ($I_{DC}/4$) through a node that is designated "Low Swing". The second terminal of bias current source ($I_{DC}/4$) is coupled to ground. The value of current $I_{OUT}$ and the value of current $I_{IN}$ from low voltage current source 230 are in the ratio of one to four. That is, the value of the output current $I_{OUT}$ is one fourth (¼) the value of the input current $I_{IN}$.

The "Low Swing" node in MPL receiver 200 is coupled to the input of a clamp circuit 240 that comprises an NMOS (N-type metal oxide semiconductor) transistor designated "MNFB" and a PMOS (P-type metal oxide semiconductor) transistor designated "MPFB". The "Low Swing" node is also coupled to an input of inverter circuit 250. The output of the clamp circuit 240 and the output of inverter circuit 250 are coupled to a node that is designated "High Swing". The "High Swing" node is coupled to an input of inverter circuit 260. The output of inverter circuit 260 is provided to an output terminal designated "OUT".

The low voltage input current mirror 230 may comprise any of a number of different types of current mirror. In one advantageous embodiment the low voltage current mirror 230 comprises a current mirror of the type described in a paper by X. Zhang and E. I. El-Masry entitled "A Regulated Body-Driven CMOS Current Source for Low Voltage Applications," IEEE Trans. Circuits Syst. II, Volume 51, pp. 571-577, October 2004.

In the MPL receiver 200 of the present invention, the low voltage input current mirror 230 provides a scaled down MPL data current. In the advantageous embodiment shown in FIG. 2 the output current $I_{OUT}$ is one fourth of the input current $I_{IN}$ in order to save power. The output current $I_{OUT}$ is compared with the bias current source ($I_{DC}/4$). The use of the low voltage input current mirror 230 allows the drain to source voltage ($V_{DS}$) of the NMOS transistor MNIN to be as large as possible. This solves the difficulty that was presented by prior art Problem No. 1.

In the MPL receiver 200 of the present invention, PMOS transistor MP Bias is used in current conveyor 220 instead of the NMOS transistor MN Bias of the prior art current conveyor 120. This makes the "acgnd" node Vdd referenced. The PMOS transistor MP Bias can also be set to a higher voltage without destroying the gain of the current conveyor 220. This solves the difficulties that were presented by prior art Problem No. 2 and by prior art Problem No. 3.

In the prior art MPL receiver 100 the minimum operating voltage Vdd is ground referenced and limited due to the orientation of current conveyor 120. The common mode input voltage in MPL receiver 100 can only go up to a certain limit without suffering from more power consumption, peaking, or gain loss.

In contrast, the MPL receiver 200 of the present invention has a Vdd referenced common mode voltage that is relatively high. This gives a current driver more dynamic range in which to work. In addition, the MPL receiver 200 of the present invention "tracks" with the supply rail (Vdd), also thereby allowing a larger range of operation.

FIG. 3 is a block diagram of a portion 300 of MPL receiver 200 illustrating a direct current (DC) analysis of the current conveyor 220 of the present invention. Assume that both the NMOS transistor MNIN and PMOS transistor MP Bias stay in saturation. Further assume that low voltage input current mirror 230 operates ideally. Then current converter 220 no longer provides any limiting factor for the minimum value of Vdd. That is, if the value of the voltage Vdd increases or decreases, then so does the voltage value at the "acgnd" node, the "ning" node, and the "$C_{IN}$" node. The fact that current converter 220 tracks the value of the supply voltage Vdd makes current converter 220 much more efficient and useful than the prior art current converter 120.

Also note that the value of the voltage at the "ning" node is somewhat higher than the voltage at the prior art "ning" node. The higher the value of Vdd, the higher the value of the voltage at the "ning" node. This feature prevents the failure of the bias current that provides the gain of the PMOS transistor MP Bias.

To keep the PMOS transistor MP Bias in saturation, the gate to source voltage of NMOS transistor MNIN must be less than or equal to the threshold voltage of PMOS transistor MP Bias.

$$Vgs_{MNIN} \leq Vth_{MPBIAS} \tag{1}$$

Equation (1) may be derived as follows.

$$VDS_{SATURATION} = Vgs - Vth \tag{2}$$

Therefore, VDS must be $$VDS \geq Vgs - Vth \tag{3}$$

$$VDS_{MPBIAS} = Vgs_{MPBIAS} - Vgs_{MNIN} \tag{4}$$

Substituting Equation (4) into Equation (3) gives:

$$Vgs_{MPBIAS} - Vgs_{MNIN} \geq Vgs_{MPBIAS} - Vth_{MPBIAS} \tag{5}$$

Subtracting the term $Vgs_{MPBIAS}$ from both sides gives:

$$-Vgs_{MNIN} \leq Vth_{MPBIAS} \tag{6}$$

$$Vgs_{MNIN} \leq Vth_{MPBIAS} \tag{7}$$

Equation (7) is the same as Equation (1). The conditions described in Equation (1) may seem unobtainable due to the dependence on Vth. However, there are two factors that help keep the conditions of Equation (1) true most of the time.

The first factor is that the drain to source voltage (VDS) on the NMOS transistor MNIN is large (due to the presence of the low voltage input current mirror 230). This results in a small gate to source voltage (Vgs) drop for NMOS transistor MNIN.

The second factor is that the source and bulk of NMOS transistor MNIN are tied together in one advantageous embodiment. This results in a reduction of the threshold voltage Vth.

As previously mentioned, assuming that both the NMOS transistor MNIN and PMOS transistor MP Bias stay in saturation and that the low voltage input current mirror 230 operates ideally, one observes that the common mode voltage is Vdd referenced. The value of voltage at the "acgnd" node is simply the gate to source voltage (Vgs) drop of the PMOS transistor MP Bias. That is, $$Vacgnd = Vdd - |Vgs_{MPBIAS}|. \tag{8}$$

To increase the common mode voltage, the size of PMOS transistor MP Bias is increased, which, in turn, increases the gain. There is no need to sink more bias current.

Using well known long-channel equations the common mode input voltage may be expressed as follows.

$$Vacgnd = Vdd - \sqrt{\frac{2I_2}{\beta_2(1 + \lambda_2 V_{DS2})}} - |Vth_2| \tag{9}$$

FIG. 4 is a block diagram of a portion 400 of MPL receiver 200 illustrating an alternating current (AC) analysis of the current conveyor 220 of the present invention. A simplified input impedance (disregarding poles) for the portion 400 of MPL receiver 200 may be derived as follows.

The voltage at node "ning" (designated as "Vning") is the gain of PMOS transistor MP Bias (transistor $M_4$). The input voltage at node "acgnd" is designated as "Vacgnd". The Vning voltage is:

$$Vning = -gm_{M4} r_{o4} Vacgnd \quad (10)$$

The value $gm_{M4}$ is the transconductance of transistor $M_4$ (PMOS transistor MP Bias). The value $r_{o4}$ is the output resistance of transistor $M_4$. The input current at node "acgnd" is given by:

$$I_{in} = -gm_{M3}(Vning - Vacgnd) \quad (11)$$

The value $gm_{M3}$ is the transconductance of transistor $M_3$ (NMOS transistor MNIN). Substituting from Equation (10) gives:

$$I_{in} = -gm_{M3}(-gm_{M4} r_{o4} Vacgnd - Vacgnd) \quad (12)$$

$$I_{in} = gm_{M3} Vacgnd(gm_{M4} r_{o4} + 1) \quad (13)$$

The simplified input impedance at node "acgnd" is:

$$Z_{in} = Vacgnd / I_{in} \quad (14)$$

$$Z_{in} = 1/[gm_{M3}(gm_{M4} r_{o4} + 1)] \quad (15)$$

Due to the gain of the amplifier formed by PMOS transistor MP Bias (transistor $M_4$) and current source $I_2$, the input impedance of current conveyor 220 can be made very low. However, the input impedance is very sensitive to variations in the values of transconductance gm in both NMOS transistor MNIN (transistor $M_3$) and PMOS transistor MP Bias (transistor $M_4$).

Although the present invention has been described in connection with an embodiment designed for use with a Mobile Pixel Link (MPL) receiver circuit, it is understood that the use of a Mobile Pixel Link (MPL) receiver circuit is illustrative. Specifically, it is understood that it is possible to practice the principles of the invention using other types of receiver circuits depending upon the requirements of a particular application.

Similarly, the input current $I_{IN}$ in the low voltage input current mirror 230 was four times the output current $I_{OUT}$ from the low voltage input current mirror 230. It is understood that the invention is not limited to the illustrative ratio of "four to one" and that other ratios of current values may also be employed depending upon the requirements of a particular application.

Although the present invention has been described with several embodiments, various changes and modifications may be suggested to one skilled in the art. It is intended that the present invention encompass such changes and modifications as fall within the scope of the appended claims.

What is claimed is:

1. An apparatus for providing an input common mode voltage in a receiver circuit configured for coupling to a transmission line through a matching resistor, wherein the apparatus comprises a current conveyor circuit, the current conveyor circuit comprising:
    a P-type metal oxide semiconductor transistor having (1) a source coupled to an operating voltage, (2) a drain coupled to a current source, and (3) a gate configured to be coupled to the transmission line through the matching resistor; and
    an N-type metal oxide semiconductor transistor having (1) a source configured to be coupled to the transmission line through the matching resistor and coupled to the gate of the P-type metal oxide semiconductor transistor, and (2) a gate coupled to the drain of the P-type metal oxide semiconductor transistor and to the current source.

2. The apparatus as set forth in claim 1, wherein the apparatus further comprises:
    an input current mirror having an input current terminal and an output current terminal;
    wherein a drain of the N-type metal oxide semiconductor transistor is coupled to the input current terminal of the input current mirror.

3. The apparatus as set forth in claim 2, wherein the apparatus further comprises:
    a clamp circuit having an input coupled to the output current terminal of the input current mirror;
    a first inverter having an input coupled to the input of the clamp circuit; and
    a second inverter having an input coupled to an output of the first inverter and to an output of the clamp circuit.

4. The apparatus as set forth in claim 2, wherein the output current terminal of the input current mirror is coupled to a bias current source.

5. The apparatus as set forth in claim 4, wherein a value of an input current on the input current terminal of the input current mirror is four times a value of an output current on the output current terminal of the input current mirror.

6. The apparatus as set forth in claim 1, wherein a bulk terminal of the N-type metal oxide semiconductor transistor is coupled to the source of the N-type metal oxide semiconductor transistor.

7. The apparatus as set forth in claim 1, wherein the receiver circuit is a mobile pixel link (MPL) receiver.

8. The apparatus as set forth in claim 7, wherein the MPL receiver is configured to operate at an MPL Level Zero current level of four hundred fifty microamperes and an MPL Level One current level of two milliamperes.

9. A mobile pixel link (MPL) receiver configured for connection to a transmission line through a matching resistor, the MPL receiver having an input common mode voltage that is referenced to an operating voltage, wherein the MPL receiver comprises:
    an operating voltage source configured to provide the operating voltage; and
    a current conveyor circuit comprising:
        a P-type metal oxide semiconductor transistor having (1) a source coupled to the operating voltage source, (2) a drain coupled to a current source, and (3) a gate configured to be coupled to the transmission line through the matching resistor; and
        an N-type metal oxide semiconductor transistor having (1) a source configured to be coupled to the transmission line through the matching resistor and coupled to the gate of the P-type metal oxide semiconductor transistor, and (2) a gate coupled to the drain of the P-type metal oxide semiconductor transistor and to the current source.

10. The MPL receiver as set forth in claim 9, wherein the MPL receiver further comprises:
    a clamp circuit having an input coupled to the output current terminal of the input current mirror;
    a first inverter having an input coupled to the input of the clamp circuit; and
    a second inverter having an input coupled to an output of the first inverter and to an output of the clamp circuit.

11. The MPL receiver as set forth in claim 10, wherein the MPL receiver further comprises:
    an input current mirror having an input current terminal and an output current terminal;

wherein a drain of the N-type metal oxide semiconductor transistor is coupled to the input current terminal of the input current mirror.

12. The MPL receiver as set forth in claim 10, wherein the output current terminal of the input current mirror is coupled to a bias current source.

13. The MPL receiver as set forth in claim 12, wherein a value of an input current on the input current terminal of the input current mirror is four times a value of an output current on the output current terminal of the input current mirror.

14. The MPL receiver as set forth in claim 9, wherein a bulk terminal of the N-type metal oxide semiconductor transistor is coupled to the source of the N-type metal oxide semiconductor transistor.

15. The MPL receiver as set forth in claim 9, wherein the MPL receiver is configured to operate at an MPL Level Zero current level of four hundred fifty microamperes and an MPL Level One current level of two milliamperes.

16. A mobile pixel link (MPL) receiver configured for connection to a transmission line through a matching resistor, the MPL receiver having an input common mode voltage that is referenced to an operating voltage, the MPL receiver comprising:
    an operating voltage source configured to provide the operating voltage;
    a current conveyor circuit comprising:
        a P-type metal oxide semiconductor transistor having (1) a source coupled to the operating voltage source (2) a drain coupled to a current source, and (3) a gate configured to be coupled to the transmission line through the matching resistor; and
        an N-type metal oxide semiconductor transistor having (1) a source configured to be coupled to the transmission line through the matching resistor and coupled to the gate of the P-type metal oxide semiconductor transistor, and (2) a gate coupled to the drain of the P-type metal oxide semiconductor transistor and to the current source; and
    an input current mirror having an input current terminal and an output current terminal;
    wherein a drain of the N-type metal oxide semiconductor transistor is coupled to the input current terminal of the input current mirror.

17. The MPL receiver as set forth in claim 16, wherein the MPL receiver is configured to track changes in the operating voltage.

18. The MPL receiver as set forth in claim 16, wherein the P-type metal oxide semiconductor transistor and the N-type metal oxide semiconductor transistor are kept in saturation during operation of the MPL receiver.

19. The MPL receiver as set forth in claim 18, wherein the P-type metal oxide semiconductor transistor and the N-type metal oxide semiconductor transistor are kept in saturation by keeping a gate-to-source voltage of the N-type metal oxide semiconductor transistor less than or equal to a threshold voltage of the P-type metal oxide semiconductor transistor.

20. The MPL receiver as set forth in claim 16, wherein a gain of the MPL receiver is increased by increasing a size of the P-type metal oxide semiconductor transistor.

* * * * *

UNITED STATES PATENT AND TRADEMARK OFFICE
CERTIFICATE OF CORRECTION

| | | |
|---|---|---|
| PATENT NO. | : 7,764,115 B1 | Page 1 of 1 |
| APPLICATION NO. | : 11/154436 | |
| DATED | : July 27, 2010 | |
| INVENTOR(S) | : Fish | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C 154(b) by 302 days.

Signed and Sealed this
Eighteenth Day of January, 2011

David J. Kappos
*Director of the United States Patent and Trademark Office*